United States Patent
Tajic et al.

(10) Patent No.: US 10,547,283 B2
(45) Date of Patent: Jan. 28, 2020

(54) BULK ACOUSTIC WAVE RESONATOR WITH A BORDER RING AND AN INNER RING

(71) Applicant: Qorvo US, Inc., Greensboro, NC (US)

(72) Inventors: Alireza Tajic, Winter Springs, FL (US); Paul Stokes, Orlando, FL (US); Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 229 days.

(21) Appl. No.: 15/279,897

(22) Filed: Sep. 29, 2016

(65) Prior Publication Data

US 2017/0263844 A1   Sep. 14, 2017

Related U.S. Application Data

(60) Provisional application No. 62/306,138, filed on Mar. 10, 2016.

(51) Int. Cl.
*H01L 41/047* (2006.01)
*H03H 9/13* (2006.01)

(52) U.S. Cl.
CPC .................... *H03H 9/131* (2013.01)

(58) Field of Classification Search
CPC ........ H03H 9/131; H03H 9/173; H03H 9/175; H03H 2009/155
See application file for complete search history.

(56) References Cited

U.S. PATENT DOCUMENTS

| | | | |
|---|---|---|---|
| 8,456,257 B1 | 6/2013 | Fattinger | |
| 2012/0049976 A1* | 3/2012 | Son | H03H 3/04 333/133 |
| 2014/0176261 A1* | 6/2014 | Burak | H03H 9/132 333/187 |
| 2015/0280687 A1 | 10/2015 | Burak et al. | |
| 2015/0318837 A1* | 11/2015 | Zou | H03H 9/02102 333/187 |

(Continued)

OTHER PUBLICATIONS

Thalhammer, Robert et al., "Finite Element Analysis of BAW Devices: Principles and Perspectives," 2015 IEEE International Ultrasonics Symposium Proceedings, Oct. 2015, IEEE, 10 pages.

(Continued)

*Primary Examiner* — Bryan P Gordon
(74) *Attorney, Agent, or Firm* — Withrow & Terranova, P.L.L.C.

(57) ABSTRACT

Bulk Acoustic Wave (BAW) resonators with a Border (BO) ring and an inner ring are provided. One BAW resonator includes a bottom electrode, a piezoelectric layer over the bottom electrode, and a top electrode over the piezoelectric layer in which an active region is formed where the top electrode and the bottom electrode overlap. The top electrode includes a BO ring extending about a periphery of the active region and an inner ring inside of and spaced apart from the BO ring. The BO ring is a mass loading of a first portion of the top electrode and the inner ring is a mass unloading of a second portion of the top electrode. Various methods include fabricating a BAW resonator with a top electrode including a mass loading BO ring and a mass unloading inner ring spaced apart from the mass loading BO ring.

22 Claims, 12 Drawing Sheets

(56) References Cited

U.S. PATENT DOCUMENTS

2015/0349743 A1* 12/2015 Burak .................. H01L 41/107
                                                    310/313 R
2017/0054430 A1   2/2017 Fattinger et al.

OTHER PUBLICATIONS

Thalhammer, Robert et al., "Spurious mode suppression in BAW resonators," 2006 IEEE Ultrasonics Symposium, Oct. 2006, IEEE, pp. 456-459.
Fattinger, "Optimization of acoustic dispersion for high performance thin film BAW resonators," IEEE Ultrasonics Symposium, 2005, pp. 1175-1178.
Fattinger, "Spurious mode suppression in coupled resonator filters," Microwave Symposium Digest, Jul. 2005, pp. 409-412.
Katila, J., et al., "Spurious Resonance Free Bulk Acoustic Wave Resonators," International Ultrasonics Symposium, 2003, vol. 1, IEEE, pp. 84-87.
Larson, John, et al., "Characterization of Reversed c-axis AlN thin films," International Ultrasonics Symposium, Oct. 2010, IEEE, pp. 1054-1059.
Park, "Advanced lateral structures of BAW resonators for spurious mode suppression," 42nd European Microwave Conference, Nov. 2012, pp. 104-107.
Final Office Action for U.S. Appl. No. 14/877,324, dated Jun. 16, 2017, 8 pages.
Non-Final Office Action for U.S. Appl. No. 14/877,324, dated Dec. 1, 2016, 8 pages.

* cited by examiner

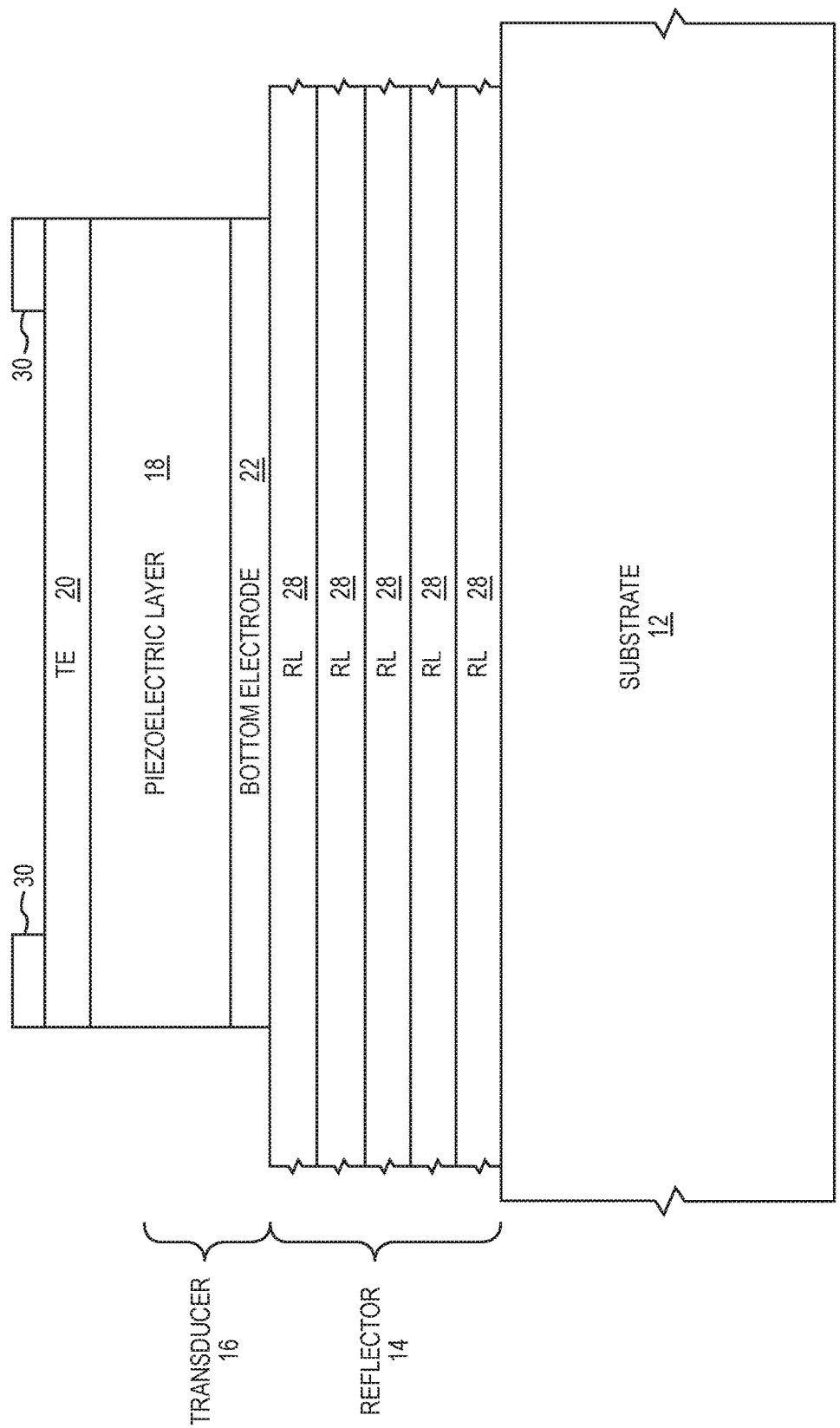

BULK ACOUSTIC WAVE RESONATOR WITH A BORDER RING AND AN INNER RING

RELATED APPLICATIONS

This application claims the benefit of provisional patent application Ser. No. 62/306,138, filed Mar. 10, 2016, the disclosure of which is hereby incorporated herein by reference in its entirety.

FIELD OF THE DISCLOSURE

The present disclosure relates to Bulk Acoustic Wave (BAW) resonators.

BACKGROUND

Acoustic resonators and, particularly, Bulk Acoustic Wave (BAW) resonators are used in many high-frequency, communication applications. In particular, BAW resonators are often employed in filter networks that operate at frequencies above 1.5 GHz and require a flat passband; have exceptionally steep filter skirts and squared shoulders at the upper and lower ends of the passband; and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G) and 4th Generation (4G) wireless devices, and are destined to dominate filter applications for 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters as well as decrease the cost and size associated therewith.

SUMMARY

Various embodiments provide Bulk Acoustic Wave (BAW) resonators with a Border (BO) ring and an inner ring and methods for fabricating such BAW resonators. One BAW resonator comprises a bottom electrode, a piezoelectric layer over the bottom electrode, and a top electrode over the piezoelectric layer in which an active region is formed where the top electrode and the bottom electrode overlap. The top electrode comprises a border (BO) ring extending about a periphery of the active region and an inner ring inside of and spaced apart from the BO ring, wherein the BO ring is a mass loading of a first portion of the top electrode and the inner ring is a mass unloading of a second portion of the top electrode. In one embodiment, the inner ring is provided by a channel recessed into the top electrode.

The inner ring, in some embodiments, has a depth in the range of 5 nm to 60 nm. In various embodiments, the inner ring has a width in the range of 1 µm to 5 µm. The inner ring, in one embodiment, has a depth in the range of 5 nm to 60 nm and a width in the range of 1 µm to 5 µm.

The top electrode, in various embodiments, comprises a gap that spaces apart the inner ring from the BO ring. The gap, in some embodiments, has a width in the range of 1 µm to 5 µm. In one embodiment, the inner ring has a depth in the range of 5 nm to 60 nm and a width in the range of 1 µm to 5 µm, and the gap has a width in the range of 1 µm to 5 µm.

In various embodiments, the BAW resonator resonates at a series resonant frequency ($f_s$) and the inner ring suppresses spurious signal modes of the BAW resonator below the series resonant frequency ($f_s$). In addition, the inner ring smooths out a phase curve of the BAW resonator below a series resonant frequency ($f_s$).

The BO ring, in some embodiments, suppresses spurious signal modes of the BAW resonator above the series resonant frequency ($f_s$). In various embodiments, the phase curve of the BAW resonator below the series resonant frequency ($f_s$) comprises less than 2 degrees of ripple. In addition, the BO ring smooths out the phase curve of the BAW resonator above the series resonant frequency ($f_s$). In some embodiments, the phase curve of the BAW resonator above and below the series resonant frequency ($f_s$) comprises less than 2 degrees of ripple.

One method for fabricating a BAW resonator comprises forming a bottom electrode, forming a piezoelectric layer over the bottom electrode, and forming a top electrode over the piezoelectric layer in which an active region is formed where the top electrode and the bottom electrode overlap. In various embodiments, forming the top electrode comprises forming a mass loading BO ring on a first portion of the top electrode and extending about a periphery of the active region and forming a mass unloading inner ring in a second portion of the top electrode that is inside of and spaced apart from the BO ring.

In one embodiment, forming the mass unloading inner ring comprises removing mass from the second portion of the top electrode to define a channel recessed into the top electrode. In some embodiments, forming the mass loading BO ring comprises adding mass to the first portion of the top electrode.

The method, in some embodiments, further comprises forming a reflector in which forming the bottom electrode comprises forming the bottom electrode over the reflector to define a Solidly Mounted BAW Resonator (SMR-BAW). Other embodiments further comprise forming a support layer and in which forming the bottom electrode comprises forming the bottom electrode over the support layer. The embodiments further comprise providing a substrate and forming a cavity in the substrate and in which forming the support layer comprises forming the support layer over the substrate and the cavity to define a Film BAW Resonator (FBAR).

BRIEF DESCRIPTION OF THE DRAWING FIGURES

The accompanying drawing figures incorporated in and forming a part of this Specification illustrate several aspects of the disclosure, and together with the description serve to explain the principles of the disclosure.

FIGS. 10A-10C are diagrams illustrating one embodiment of a method for fabricating a BAW resonator.

DETAILED DESCRIPTION

Figure 1:
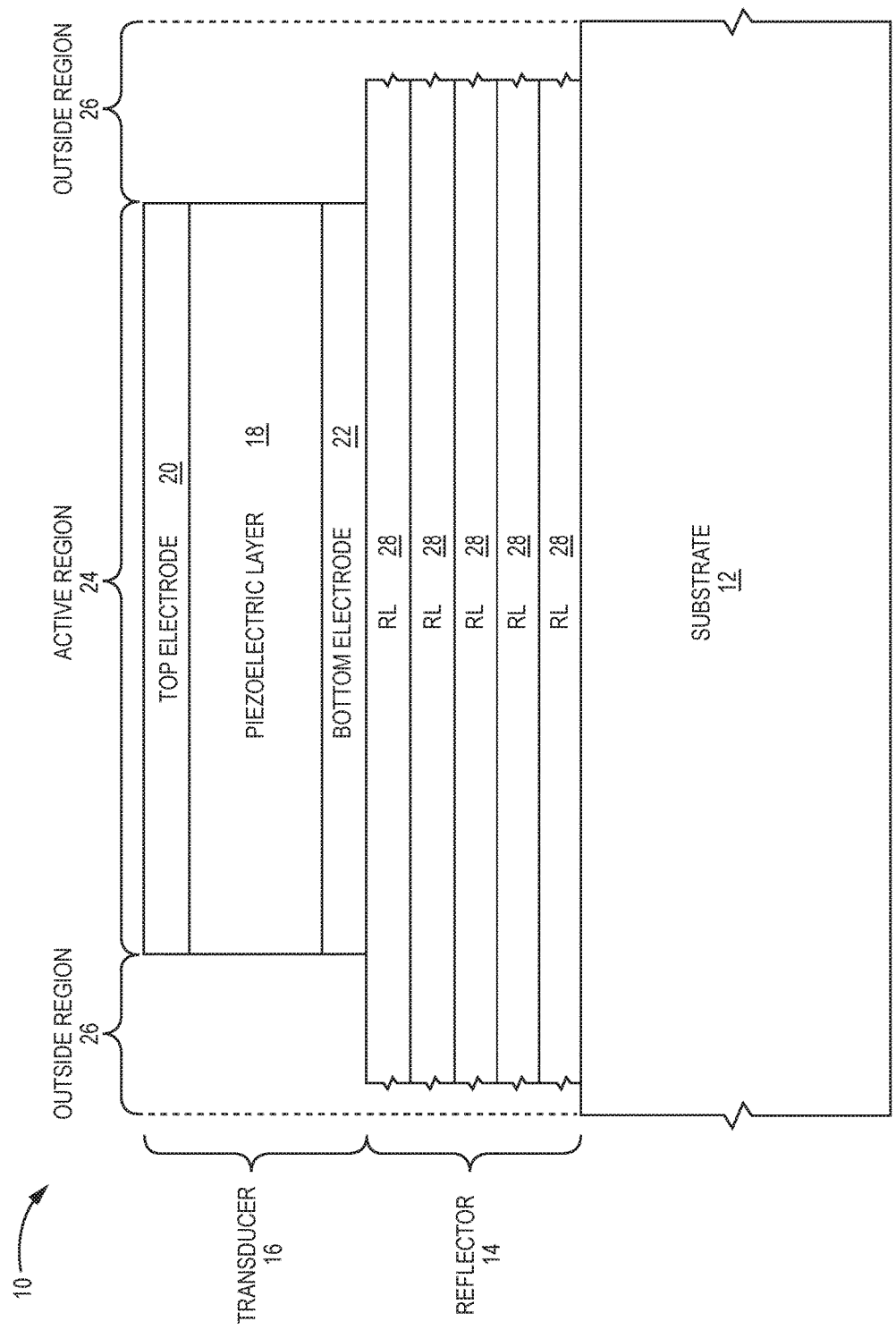
FIG. 1 is a diagram illustrating a conventional Bulk Acoustic Wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or "extending onto" another element, it can be directly on or extend directly onto the other element or intervening elements may also be present. In contrast, when an element is referred to as being "directly on" or "extending directly onto" another element, there are no intervening elements present. Likewise, it will be understood that when an element such as a layer, region, or substrate is referred to as being "over" or "extending over" another element, it can be directly over or extend directly over the other element or intervening elements may also be present. In contrast, when an element is referred to as being "directly over" or "extending directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Bulk Acoustic Wave (BAW) resonators are used in many high-frequency filter applications. An exemplary BAW resonator 10 is illustrated in FIG. 1. The BAW resonator 10 generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of Tungsten (W), Molybdenum (Mo), Platinum (Pt), Aluminum Copper (AlCu), or like material, and the piezoelectric layer 18 may be formed of Aluminum Nitride (AlN), Zinc Oxide (ZnO) or other appropriate piezoelectric material. Although shown in FIG. 1 as each including a single layer, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24, and is not electrically driven.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically-propagating acoustic waves in the transducer 16. Acoustic waves traveling upwardly are reflected back into the transducer 16 by the air-metal boundary at the top surface of the top electrode 20. Acoustic waves traveling downwardly are reflected back into the transducer 16 by the reflector 14, or by an air cavity, which is provided just below the transducer in a Film BAW Resonator (FBAR).

The reflector 14 is typically formed by a stack of reflector layers (RL) 28, which alternate in material composition to produce a significant reflection coefficient at the junction of adjacent reflector layers 28. Typically, the reflector layers 28 alternate between materials having high and low acoustic impedances, such as tungsten (W) and silicon dioxide ($SiO_2$). While only five reflector layers 28 are illustrated in FIG. 1, the number of reflector layers 28 and the structure of the reflector 14 will vary from one design to another.

Figure 2:
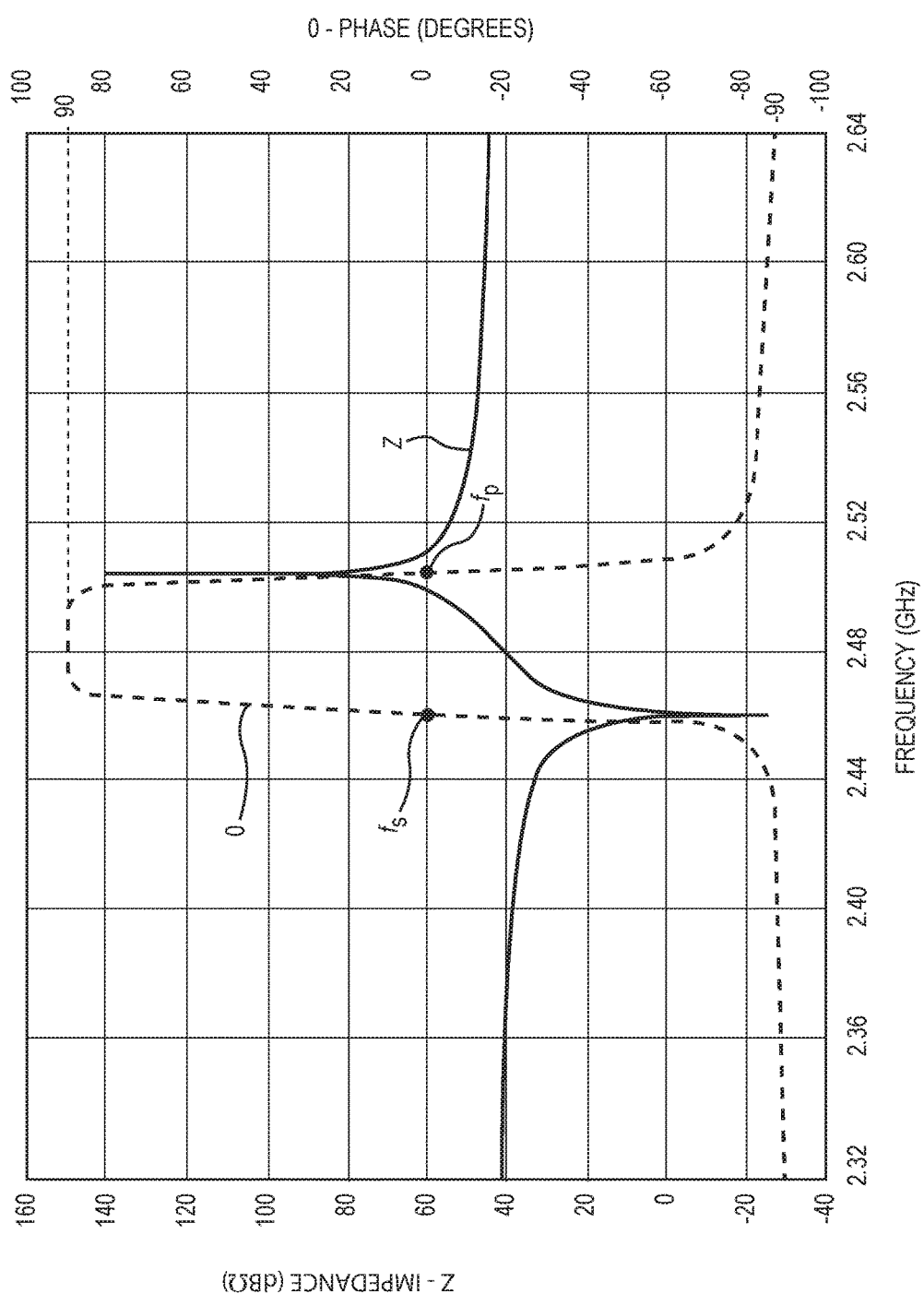
FIG. 2 is a diagram graphically illustrating the magnitude and phase of the electrical impedance as a function of the frequency for a relatively ideal BAW resonator.

The magnitude (Z) and phase ($\phi$) of the electrical impedance as a function of the frequency for a relatively ideal BAW resonator 10 is provided in FIG. 2. The magnitude (Z) of the electrical impedance is illustrated by the solid line, while the phase (φ) of the electrical impedance is illustrated by the dashed line. A unique feature of the BAW resonator 10 is that it has both a resonance frequency and an anti-resonance frequency. The resonance frequency is typically referred to as the series resonance frequency ($f_s$), the anti-resonance frequency is typically referred to as the parallel resonance frequency ($f_p$). The series resonance frequency ($f_s$) occurs when the magnitude of the impedance, or reactance, of the BAW resonator 10 approaches zero. The parallel resonance frequency ($f_p$) occurs when the magnitude of the impedance, or reactance, of the BAW resonator 10 peaks at a significantly high level. In general, the series resonance frequency ($f_s$) is a function of the thickness of the piezoelectric layer 18 and the mass of the bottom and top electrodes 20 and 22.

For the phase, the BAW resonator 10 acts like an inductance that provides a 90° phase shift between the series resonance frequency ($f_s$) and the parallel resonance frequency ($f_p$). In contrast, the BAW resonator 10 acts like a capacitance that provides a −90° phase shift below the series resonance frequency ($f_s$) and above the parallel resonance frequency ($f_p$). The BAW resonator 10 presents a very low, near zero, resistance at the series resonance frequency ($f_s$), and a very high resistance at the parallel resonance frequency ($f_p$). The electrical nature of the BAW resonator 10 lends itself to the realization of a very high Q (quality factor) inductance over a relatively short range of frequencies, which has proven to be very beneficial in high frequency filter networks, especially those operating at frequencies around 1.8 GHz and above.

Figure 3:
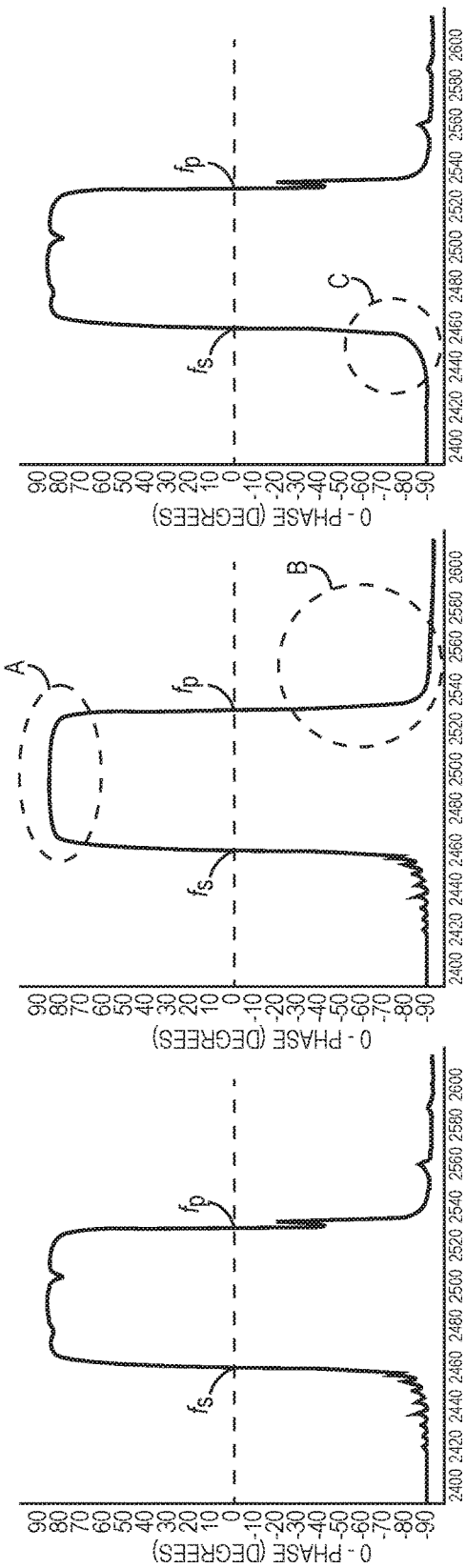
FIGS. 3A-3C are diagrams graphically illustrating the phase curves for various conventional BAW resonators.

Unfortunately, the phase (φ) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency ($f_s$), between the series resonance frequency ($f_s$) and the parallel resonance frequency ($f_p$), and above the parallel resonance frequency ($f_p$). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential Q associated with the BAW resonator 10.

Figure 4:
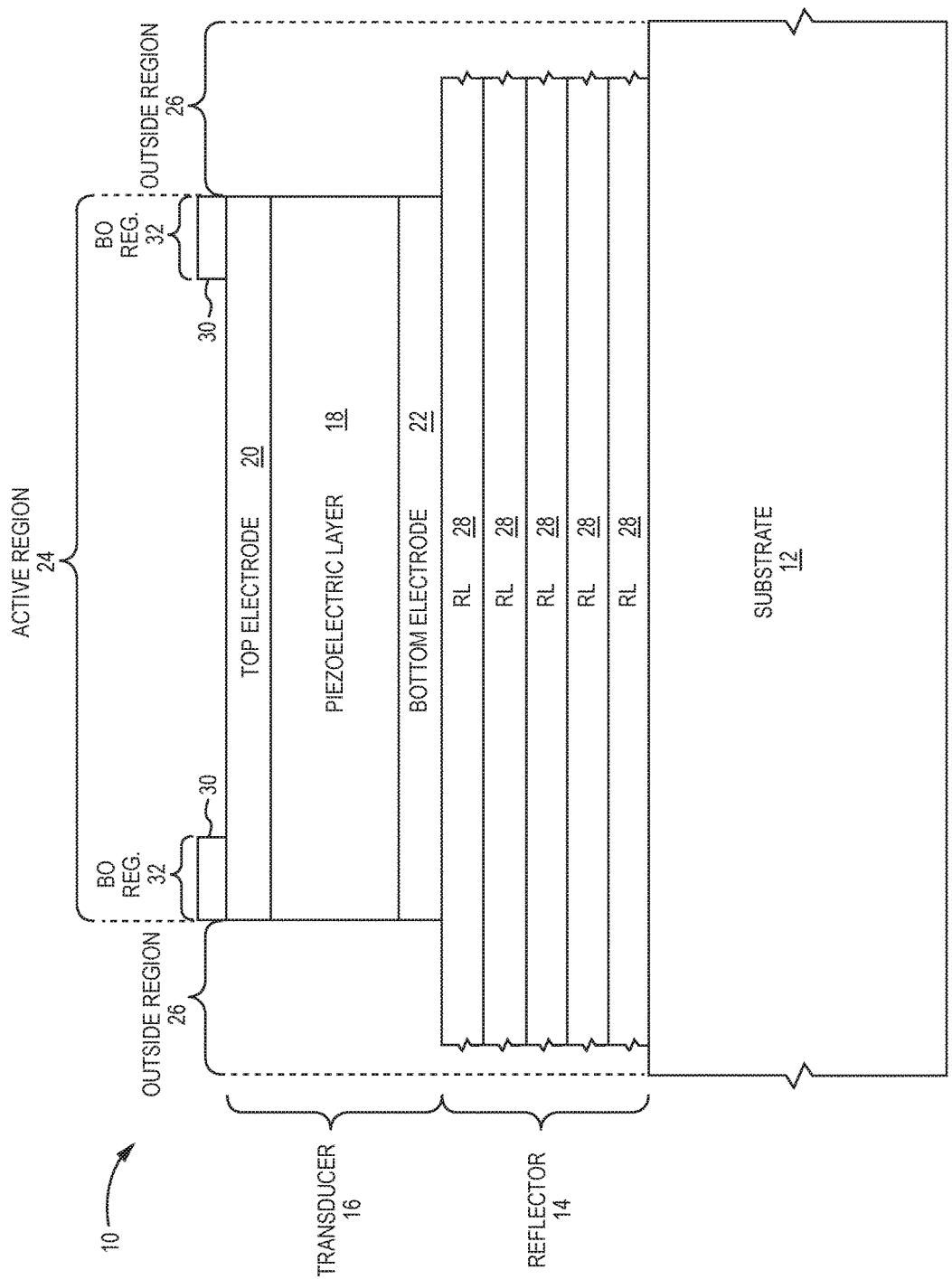
FIG. 4 is a diagram illustrating a conventional BAW resonator with a top electrode including a border (BO) ring.

As illustrated in FIG. 4, a border (BO) ring 30 is formed on or within the top electrode 20 to suppress certain of the spurious modes. The spurious modes that are suppressed by the BO ring 30 are those above the series resonance frequency ($f_s$), as highlighted by circles A and B in the phase curve of FIG. 3B. Circle A shows a suppression of the ripple, and thus the spurious mode, in the passband of the phase curve, which resides between the series resonance frequency ($f_s$) and the parallel resonance frequency ($f_p$). Circle B shows suppression of the ripple, and thus the spurious modes, above the parallel resonance frequency ($f_p$). Notably, the spurious mode in the upper shoulder of the passband, which is just below the parallel resonance frequency $f_p$, and the spurious modes above the passband are suppressed, as evidenced by the smooth or substantially ripple free phase curve between the series resonance frequency ($f_s$) and the parallel resonance frequency ($f_p$) and above the parallel resonance frequency ($f_p$).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency ($f_s$), the BO ring 30 has little or no impact on those spurious modes below the series resonance frequency ($f_s$), as shown by the ripples in the phase curve below the series resonance frequency ($f_s$) in FIG. 3B. A technique referred to as apodization is often used to suppress the spurious modes that fall below the series resonance frequency ($f_s$).

Apodization tries to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency ($f_s$) are suppressed, as evidence by the smooth or substantially ripple free phase curve below the series resonance frequency ($f_s$). Assuming no BO ring 32 is provided, one can readily see in FIG. 3C that apodization fails to suppress those spurious modes above the series resonant frequency ($f_s$). As such, the typical BAW resonator 10 employs both apodization and the BO ring 30.

Figure 5:
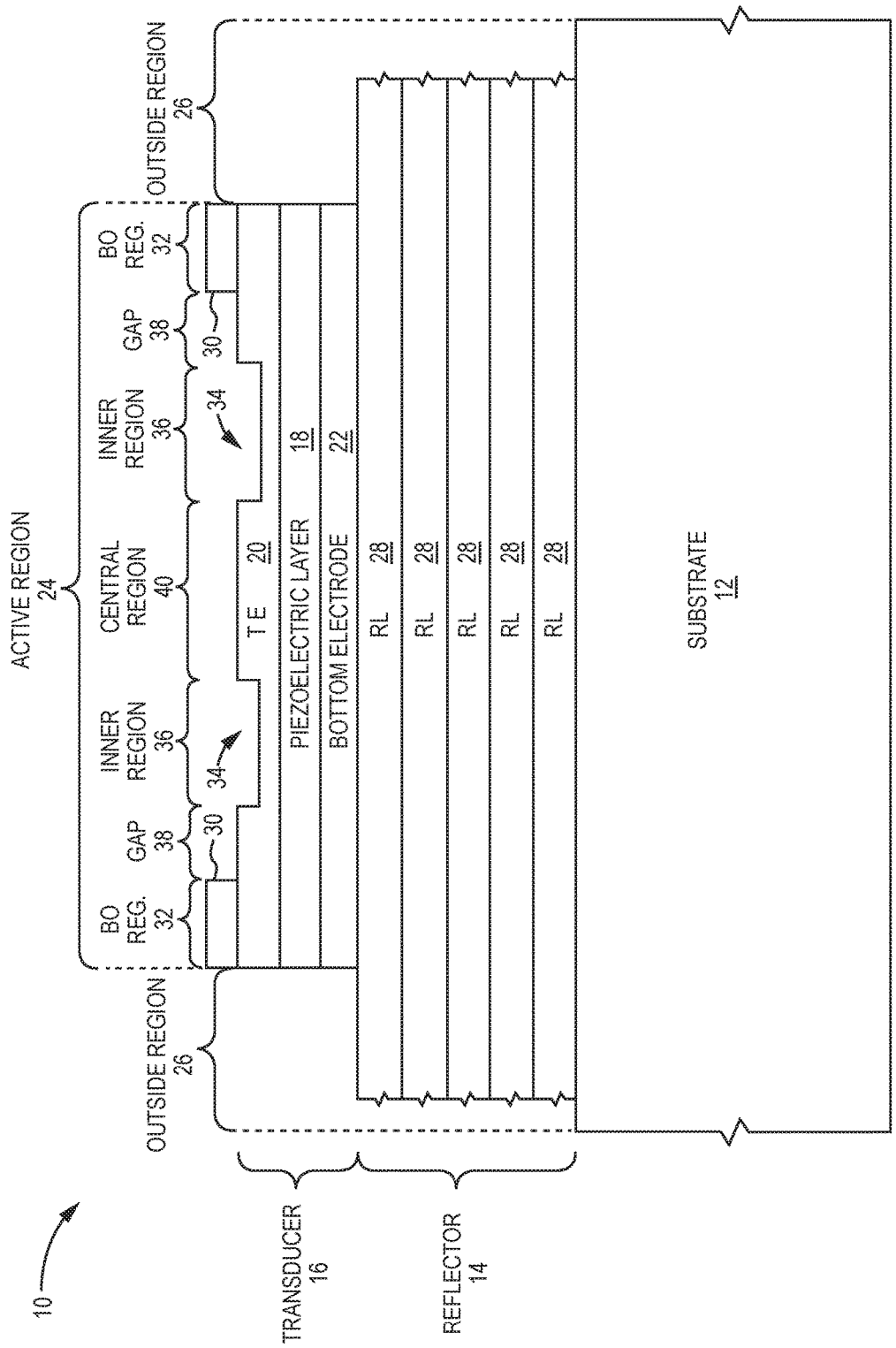
FIG. 5 is a diagram illustrating one embodiment of a BAW resonator with a top electrode including a BO ring and an inner ring spaced apart from the BO ring.

A supplement to or alternative for apodization is described below. With reference to FIG. 5, a modified BAW resonator 10' is shown with both the BO ring 30 and an inner ring 34. The inner ring 34 is a ringed region associated with the top electrode (TE) 20 where mass has been reduced. As depicted in FIG. 5, the inner ring 34 may be formed by a channel being recessed into the top electrode 20. Alternatively, a portion of the top electrode 20 that is associated with the inner ring 34 may be formed using materials that have less mass than the materials used to form the remainder of the top electrode 20.

In various embodiments, a passivation layer, which is not shown, may be formed over the top electrode 20. In some embodiments, the inner ring 34 may be formed in the passivation layer instead of or in addition to being formed in the top electrode 20.

The region below the inner ring 34 substantially provides another BO region, which is referred to as an inner region 36, inside of the border region 32. The inner ring 34 (and inner region 36) may be spaced apart from the border ring 30 (and the border region 32) by a gap 38. The region inside of the inner region 36 is referred to as the central region 40. Employing the inner ring 34 to suppress spurious modes below the series resonance frequency ($f_s$) instead of apodization results in significantly improved performance, and in particular, higher Q values, better energy confinement in the active region 24, steeper shoulders on the phase curve's passband, higher coupling factors, and the like. As a result, use of the inner ring 34 improves performance over apodization, reduces footprint. However, and as noted above, apodization may be used in combination with the inner ring 34. In one embodiment, the presence of gap 38 allows a highly effective solution to have a deeper inner border ring 34, and thus, better manufacturing control of its depth. Another advantage of the gap 38 is improved process margin in aligning the inner border ring 34 to the border ring 30.

Figure 6:
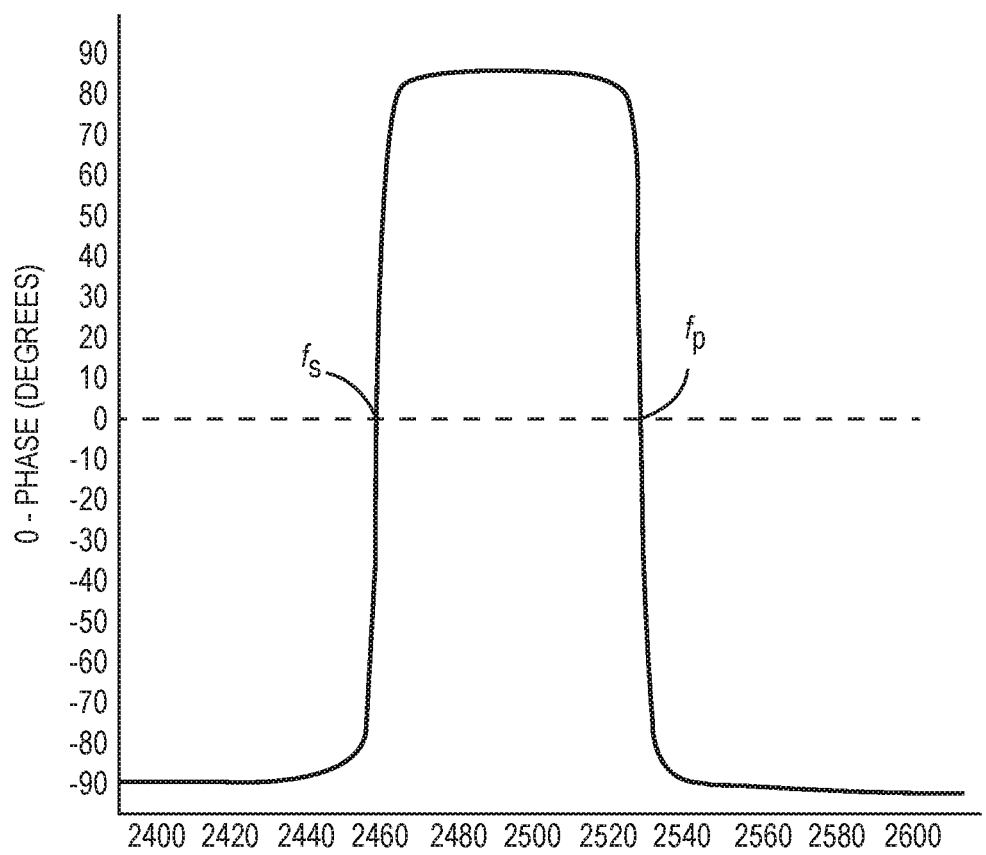
FIG. 6 is a diagram graphically illustrating the phase curve for the BAW resonator discussed with reference to FIG. 5.

FIG. 6 illustrates a phase curve for the BAW resonator 10' discussed with reference to FIG. 5. Notably, combining the inner ring 34 with the BO ring 30 reduces the ripple, which is evidence of the spurious modes being suppressed, throughout the phase curve. Thus, spurious modes are substantially or completely suppressed 1) below the series resonance frequency ($f_s$), 2) between the series resonance frequency ($f_s$) and the parallel resonance frequency ($f_p$), and 3) above the parallel resonance frequency ($f_p$), as evidence by the smooth or substantially ripple free phase curve.

Figure 7:
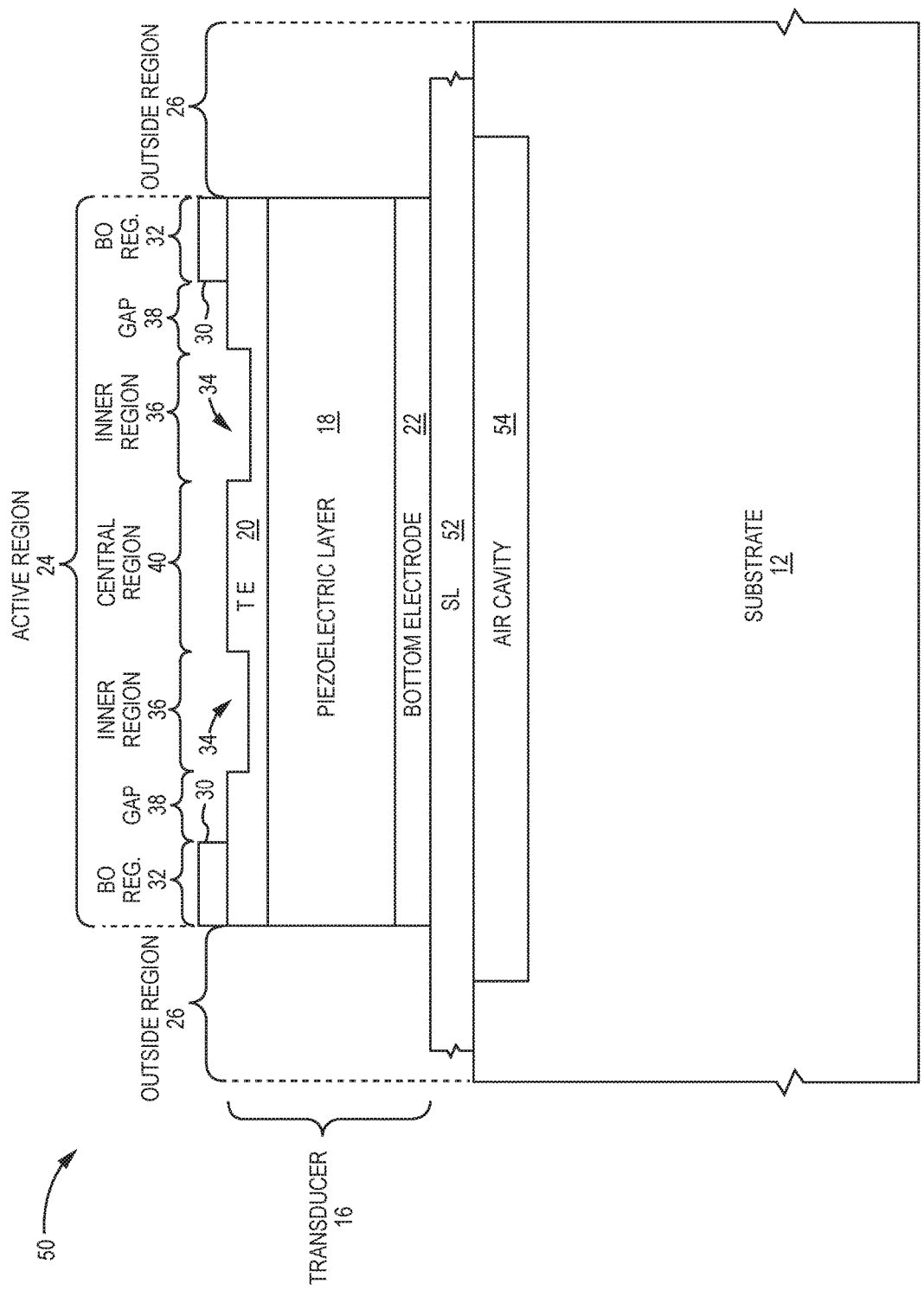
FIG. 7 is a diagram of one embodiment of a Film Bulk Acoustic Wave Resonator (FBAR) including a BO ring and an inner ring spaced apart from the BO ring.

The various embodiments of the BAW resonator 10' have been discussed with reference to a Solidly Mounted Baw (SMR-BAW) resonator; however, the structure of the top electrode 20 including the BO ring 30, the inner ring 34, and the gap 38 are not limited to SMR-BAW resonators. That is, the various embodiments of the top electrode 20 including the BO ring 30, the inner ring 34, and the gap 38 may be applied to a Film BAW Resonator (FBAR) 50 in which the transducer 16 with the top electrode 20 including the BO ring 30, the inner ring 34, and the gap 38 are formed over a support layer (SL) 52 above an air cavity 54 in the substrate 12, as illustrated in FIG. 7, instead of over the reflector 14 in the BAW resonator 10'.

Figure 8:
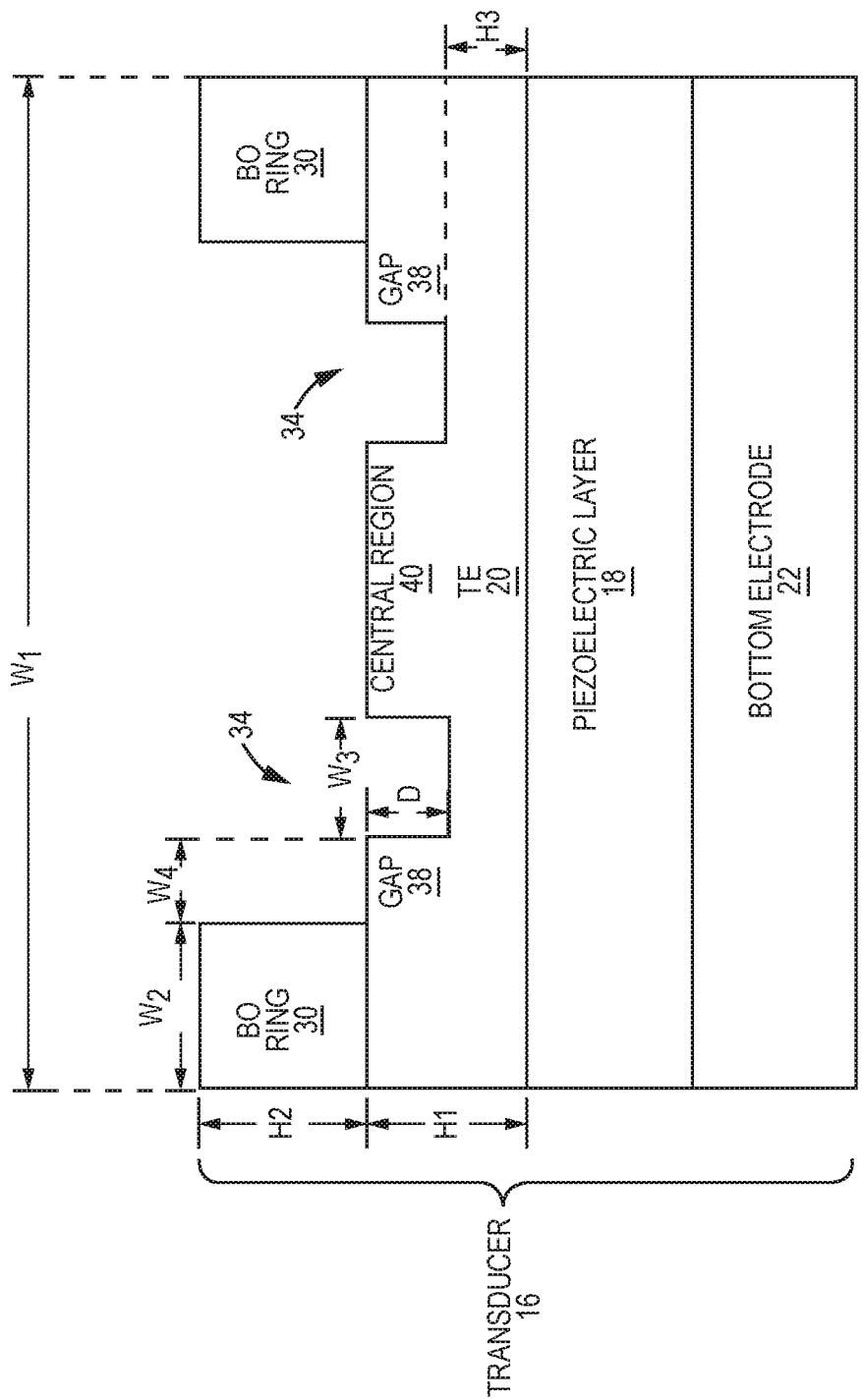
FIG. 8 is a diagram of a portion of the BAW resonators discussed with reference to FIGS. 5 and 7.

With reference now to FIG. 8, the top electrode 20 has a thickness or height (H1) in the range of about 0.1 µm to about 0.5 µm and a width (W1) in the range of about 60 µm to about 200 µm. The BO ring 30, in various embodiments, has a height (H2) in the range of about 30 nm to about 100 nm and a width (W2) in the range of about 1 µm to about 5 µm.

The BO ring 30 adds mass or mass loads the perimeter of the top electrode 20 to define the periphery of the active region 24 to better suppress spurious modes in the active region 24 between the series resonance frequency ($f_s$) and the parallel resonance frequency ($f_p$) (or the passband) and above the parallel resonance frequency ($f_p$) of the BAW resonator 10' and the FBAR 50. Evidence that the BO ring 30 suppresses these spurious modes is shown in FIG. 6 where the phase curve between the series resonance frequency ($f_s$) and the parallel resonance frequency ($f_p$) and above the parallel resonance frequency ($f_p$) is smooth or substantially ripple free. In some embodiments, "substantially ripple free" means that the phase curve includes less than about two (2) degrees of ripple between the series resonance frequency ($f_s$) and the parallel resonance frequency ($f_p$) and above the parallel resonance frequency ($f_p$). In other embodiments, "substantially ripple free" means that the phase curve includes less than about one (1) degree of ripple between the series resonance frequency ($f_s$) and the parallel resonance frequency ($f_p$) (or the passband) and above the parallel resonance frequency ($f_p$).

The inner ring 34 has a depth (D) in the range of about 5 nm to about 60 nm. In some embodiments, the inner ring 34 has a thickness or height (H3) that is less than the height (H1) of the top electrode 20 and a width (W3) in the range of about 1 µm to about 5 µm. As such, the inner ring 34 may be referred to as a "mass reducing" or "mass unloading" inner ring. In some embodiments, the inner ring 34 is a mass reducing or mass unloading inner ring because the inner ring 34 is a channel or a portion of the top electrode 20 that has less mass than other portions of the top electrode 20 having including the same dimensions as the inner ring 34.

The inner ring 34, in other embodiments, is a mass reducing or mass unloading inner ring because the inner ring 34 is a channel filled with a lighter material than the material forming other portions of the top electrode 20 with the same dimensions as the inner ring 34.

The inner ring 34, in various embodiments, suppresses spurious modes in the active region 24 below the series resonant frequency ($f_s$) similar to apodization. Evidence that the inner ring 34 suppresses spurious modes in the active region 24 below the series resonant frequency ($f_s$) is shown in FIG. 6 where the phase curve that is below the series resonance frequency ($f_s$) is smooth or substantially ripple free. In some embodiments, "substantially ripple free" means that the phase curve includes less than about two (2) degrees of ripple below the series resonance frequency ($f_s$). In other embodiments, "substantially ripple free" means that the phase curve includes less than about one (1) degree of ripple below the series resonance frequency ($f_s$).

In various embodiments, the gap 38 has a width (W4) in the range of about 0.25 µm to about 1.0 µm, although the gap 38 may have a smaller or larger width (W4). As such, the BO ring 30 is separated or spaced apart from the inner ring 34 by about 0.25 µm to about 1.0 µm.

The gap 38, in various embodiments, is a portion of the top electrode 20 between the BO ring 30 and the inner ring 34 and, as such, has the same thickness or height (H1) and materials as the top electrode 20. In other words, the BO ring 30 and the inner ring 34 are separated or spaced apart by the gap 38 such that the BO ring 30 and the inner ring 34 are not adjacent to one another.

Figure 9:
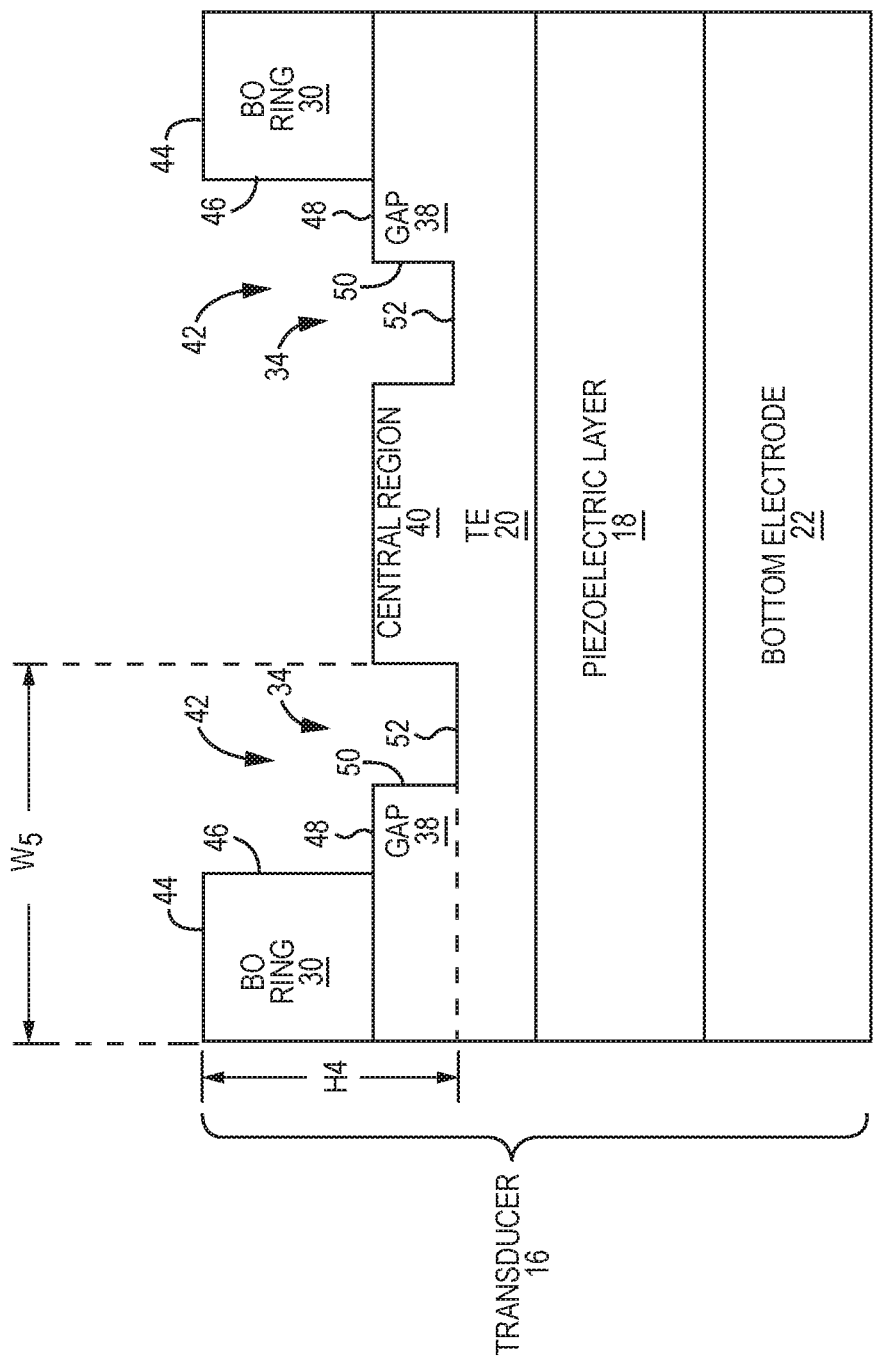
FIG. 9 is a diagram of a portion of the BAW resonators discussed with reference to FIGS. 5 and 7 that illustrates a stepped structure included therein.

As illustrated in FIG. 9, the BO ring 30, the gap 38, and the inner ring 34 form a stepped structure 42. The stepped structure 42, at least in the illustrated embodiment, is a tri-level structure comprising, in descending order, a horizontal surface 44, a vertical surface 46, a horizontal surface 48, a vertical surface 50, and a horizontal surface 52.

The height (H4) of the stepped BO structure 42 includes the depth D of the inner ring 34 and the height H2 of the BO ring 30, or D+H2. In various embodiments, the overall height H4 of the stepped BO structure 42 is in the range of about 35 nm to about 160 nm since D=5 nm-60 nm and H2=30 nm-100 nm.

The width (W5) of the stepped structure 42 includes the width (W2) of the BO ring 30, the width (W3) of the inner ring 34, and the width (W4) of the gap 38 or W5=W2+W3+W4. In various embodiments, the overall width (W5) of the stepped structure 42 is in the range of about 2.25 µm to about 11 µm since W2=1 µm-5 µm, W3=1 µm-5 µm, and W4=0.25 µm-1 µm.

At least in the embodiment of the BAW resonators illustrated in FIGS. 5, 7, and 8, the depth (D) of the inner ring 34 is 5 nm, the width (W2) of the inner ring 34 is 1.5 µm, the width (W4) of the gap 38 is 1 µm, the height (H3) of the BO ring 30 is 60 nm, and the width (W3) of the BO ring 30 is 2.5 µm. Thus, the height (H4) and width (W5) of the stepped structure 42 are 65 nm and 5 µm, respectively.

Figure 10A:
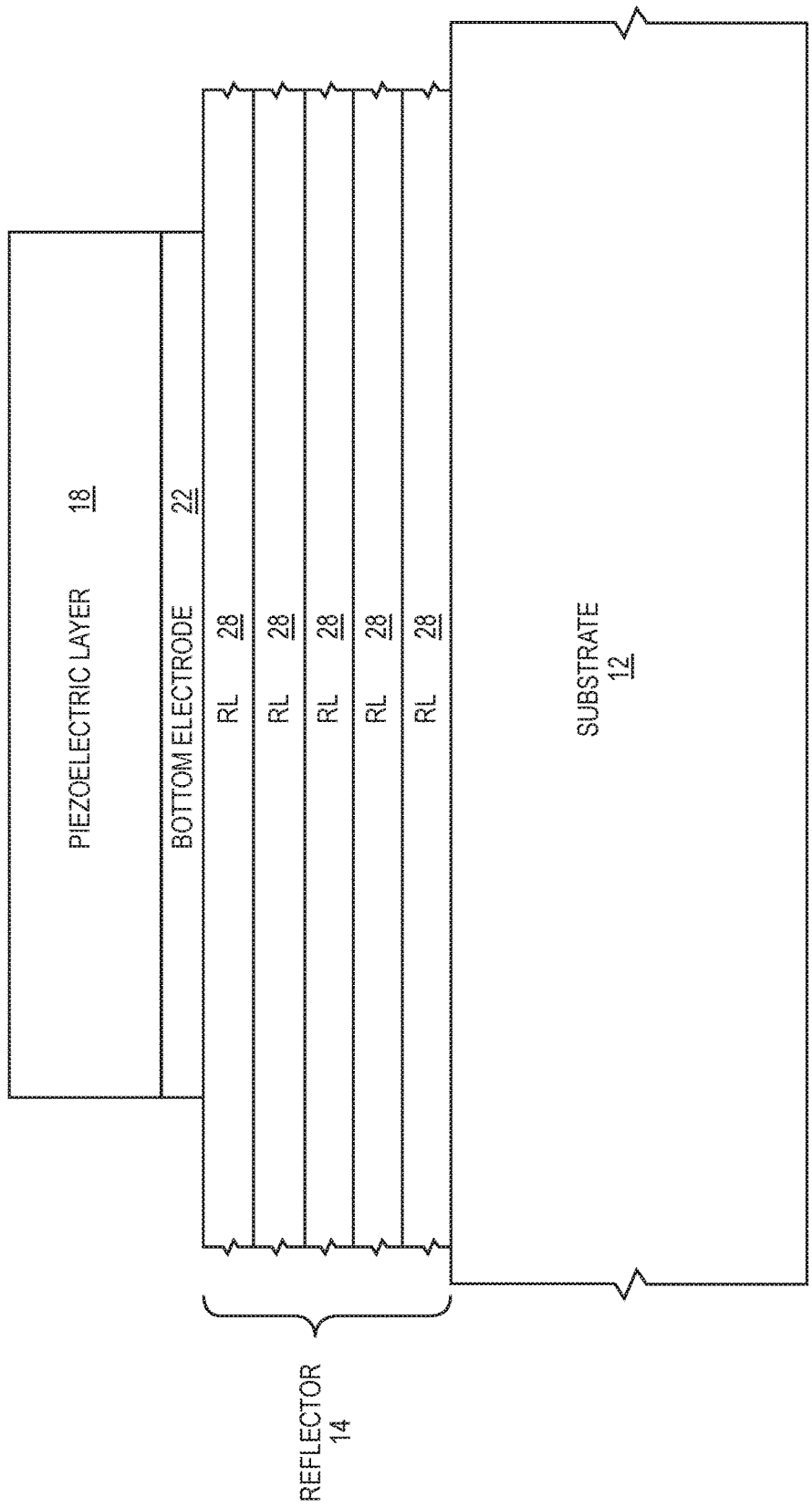
Figure 10C:
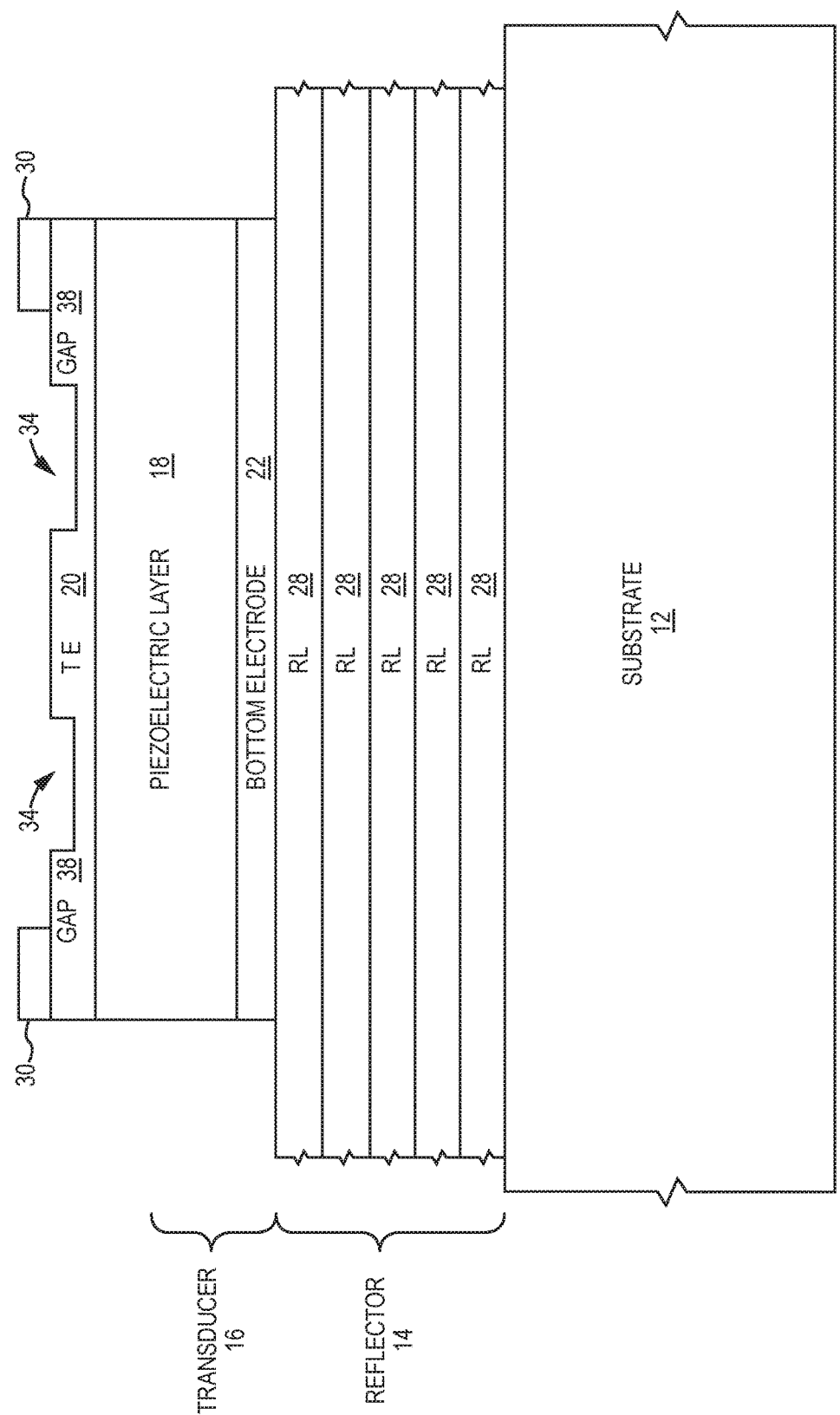

FIGS. 10A-10C are diagrams illustrating one embodiment of a method for fabricating the BAW resonator 10'. At least in the embodiment illustrated in FIG. 10A, the method comprises providing the substrate 12 and the reflector 14 on the substrate 12 in the BAW resonator 10'.

The bottom electrode 22 is deposited over the top layer of the reflector 14 and the piezoelectric layer 18 is deposited over the bottom electrode 22. The top electrode 20 including, in some embodiments, the BO ring 30 as a thickened perimeter portion of the top electrode 20 is deposited over a portion of the piezoelectric layer 18 to form the transducer 16, as illustrated in FIG. 10B. In other embodiments, the top electrode 20 is deposited over the portion of the piezoelectric layer 18 and the BO ring 30 is separately formed over the peripheral portion of the top electrode 20. In embodiments in which the top electrode 20 comprises multiple layers forming a top electrode stack, the BO ring 30 may be deposited over any layer in the top electrode stack or may be a thickened portion of any layer in the top electrode stack.

The top electrode 18 with the BO ring 30, without the BO ring 30, and the BO ring 30 separately itself may be deposited using any deposition technique known in the art or developed in the future. Example deposition techniques include but are not limited to, ion beam deposition (IBD), chemical vapor deposition (CVD), physical vapor deposition (PVD), molecular beam epitaxy (MBE), electrochemical deposition (ECD), and/or the like deposition techniques.

A contiguous portion of the top electrode 20 is removed to create the channel defining the inner ring 34, as shown in FIG. 10C. The inner ring 34 is removed from an inner portion of the top electrode 20 so as to be not adjacent to and separated or spaced apart from the BO ring 30 by the gap 38 in the top electrode 20.

The portion defining the inner ring 34 may be trimmed or removed using any removal technique known in the art or developed in the future. Example trimming or removal techniques include, but are not limited to, physical dry etching, wet etching, reactive ion etching, and the like trimming techniques.

In various embodiments, a contiguous portion of a passivation layer, not shown, over the top electrode 20 may be removed to create the channel defining the inner ring 34. In some embodiments, a contiguous portion of both the passivation layer and the top electrode 20 may be removed to create the channel defining the inner ring 34.

While FIGS. 10A-10C and the above discussion have been made with respect to the fabrication of the BAW resonator 10', the method illustrated and described with reference to FIGS. 10A-10C are not limited to the BAW resonator 10' and may be applied to the FBAR resonator 50. A difference between fabricating the BAW resonator 10' and fabricating the FBAR resonator 50 is that the transducer 16 in the BAW resonator 10' is formed on the top layer 28 of the reflector 14, while the transducer 16 in the FBAR resonator 50 is formed on the support layer 52 that is over the substrate 12 and the cavity 54.

The diagrams in the above figures illustrate the architecture, structure, topology, functionality, and operation of possible implementations of systems, devices, and methods according to various embodiments. In this regard, each diagram may represent a module or segment and that, in some alternative implementations, the function and/or order noted in the diagrams may occur out of the order presented in the figures. For example, two figures shown in succession may, in fact, be performed concurrently, or the figures may sometimes be performed in the reverse order, depending upon the functionality involved. It will also be noted that each diagram and/or illustration can be fabricated by special purpose systems and/or devices that perform the specified functions or acts.

Although the various embodiments has been described with respect to particular aspects, such aspects are for illustrative purposes only and should not be considered to limit the various embodiments. Various alternatives and changes will be apparent to those of ordinary skill in the art upon reading this application.

Those skilled in the art will also recognize improvements and modifications to the preferred embodiments of the present disclosure. All such improvements and modifications are considered within the scope of the concepts disclosed herein and the claims that follow.

What is claimed is:

1. A Bulk Acoustic Wave (BAW) resonator comprising:
a bottom electrode;
a piezoelectric layer over the bottom electrode; and
a top electrode over the piezoelectric layer, wherein an active region is formed where the top electrode and the bottom electrode overlap, and the top electrode comprises:
a border (BO) ring extending about a periphery of the active region; and
an inner ring inside of and spaced apart from the BO ring by a gap portion of the top electrode, wherein the BO ring is a mass loading of a first portion of the top electrode and the inner ring is a mass unloading of a second portion of the top electrode such that the inner ring forms a smallest height of the top electrode.

2. The BAW resonator of claim 1 wherein the inner ring is provided by a channel recessed into the top electrode.

3. The BAW resonator of claim 1 wherein the inner ring has a depth in the range of 5 nm to 60 nm.

4. The BAW resonator of claim 1 wherein the inner ring has a width in the range of 1 µm to 5 µm.

5. The BAW resonator of claim 1 wherein the inner ring has a depth in the range of 5 nm to 60 nm and a width in the range of 1 µm to 5 µm.

6. The BAW resonator of claim 1 wherein:
the inner ring has a depth in the range of 5 nm to 60 nm and a width in the range of 1 µm to 5 µm; and
the gap portion has a width in the range of 0.25 µm to 1 µm.

7. The BAW resonator of claim 1 wherein the BAW resonator resonates at a series resonant frequency ($f_s$) and the inner ring suppresses spurious signal modes of the BAW resonator below the series resonant frequency ($f_s$).

8. The BAW resonator of claim 7 wherein the BO ring suppresses spurious signal modes of the BAW resonator above the series resonant frequency ($f_s$).

9. The BAW resonator of claim 8 wherein a phase curve of the BAW resonator below the series resonant frequency ($f_s$) comprises less than 2 degrees of ripple.

10. The BAW resonator of claim 8 wherein a phase curve of the BAW resonator above the series resonant frequency ($f_s$) comprises less than 2 degrees of ripple.

11. The BAW resonator of claim 8 wherein a phase curve of the BAW resonator above and below the series resonant frequency ($f_s$) comprises less than 2 degrees of ripple.

12. The BAW resonator of claim 1 further comprising:
a substrate; and
a reflector over the substrate, wherein the bottom electrode is over the reflector to define a Solidly Mounted (SMR) BAW resonator.

13. The BAW resonator of claim 1 further comprising:
a substrate comprising an air cavity; and
a support layer over the substrate, wherein:
the bottom electrode is over the support layer, and
the air cavity is below the active region to define a Film BAW Resonator (FBAR).

14. A method for fabricating a Bulk Acoustic Wave (BAW) resonator comprising:
forming a bottom electrode;
forming a piezoelectric layer over the bottom electrode; and forming a top electrode over the piezoelectric layer, wherein:
an active region is formed where the top electrode and the bottom electrode overlap;
a mass loading border (BO) ring is provided for a first portion of the top electrode and extends about a periphery of the active region; and
a mass unloading inner ring is provided for a second portion of the top electrode that is inside of and spaced apart from the BO ring by a gap portion of the top electrode such that the inner ring forms a smallest height of the top electrode.

15. The method of claim 14 wherein the mass unloading inner ring is provided by forming a channel in the second portion of the top electrode to define a channel recessed into the top electrode.

16. The method of claim 15 wherein the mass loading BO ring is provided by adding mass to the first portion of the top electrode.

17. The method of claim 14 wherein the mass unloading inner ring is provided by forming a channel in the second portion of the top electrode to define a channel recessed into the top electrode and filling the channel with a first material having less mass than a second material used in the top electrode.

18. The method of claim 14 further comprising forming a reflector, wherein forming the bottom electrode comprises forming the bottom electrode over the reflector to define a Solidly Mounted (SMR) BAW resonator.

19. The method of claim 14, further comprising:
providing a substrate; and
forming a support layer over the substrate, wherein:
a cavity is provided in the substrate;
the cavity is under the active region; and
the bottom electrode is formed over the support layer to define a Film BAW Resonator (FBAR).

20. The BAW resonator of claim 1 wherein the BO ring, the gap portion, and the inner ring form a stepped structure across the top electrode.

21. The BAW resonator of claim 1 wherein the BO ring, the gap portion, and the inner ring form a tri-level structure comprising descending heights from the BO ring to the inner ring.

22. The BAW resonator of claim 1 wherein a central portion of the top electrode is peripherally bounded by the inner ring, and the gap portion and the central portion comprise a same thickness of the top electrode.

* * * * *